US008726122B2

(12) United States Patent
Pisek

(10) Patent No.: US 8,726,122 B2
(45) Date of Patent: May 13, 2014

(54) HIGH THROUGHPUT LDPC DECODER

(75) Inventor: Eran Pisek, Plano, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 69 days.

(21) Appl. No.: 13/463,774

(22) Filed: May 3, 2012

(65) Prior Publication Data

US 2012/0290892 A1 Nov. 15, 2012

Related U.S. Application Data

(60) Provisional application No. 61/485,049, filed on May 11, 2011.

(51) Int. Cl.
*H03M 13/00* (2006.01)

(52) U.S. Cl.
USPC ............ 714/758; 714/763; 714/752; 714/801

(58) Field of Classification Search
None
See application file for complete search history.

(56) References Cited

U.S. PATENT DOCUMENTS

| | | | | |
|---|---|---|---|---|
| 7,631,241 | B2 * | 12/2009 | Park et al. | 714/752 |
| 2005/0166132 | A1 * | 7/2005 | Shen et al. | 714/801 |
| 2008/0263425 | A1 | 10/2008 | Lakkis | |
| 2009/0063933 | A1 * | 3/2009 | Richardson et al. | 714/763 |
| 2010/0192040 | A1 | 7/2010 | Yedidia et al. | |
| 2011/0010602 | A1 * | 1/2011 | Chung et al. | 714/752 |
| 2011/0103519 | A1 | 5/2011 | Shokrollahi et al. | |

OTHER PUBLICATIONS

International Search Report dated Nov. 29, 2012 in connection with International Patent Application No. PCT/KR2012/003704.

Written Opinion of the International Searching Authority dated Nov. 29, 2012 in connection with International Patent Application No. PCT/KR2012/003704.

* cited by examiner

*Primary Examiner* — John Trimmings

(57) ABSTRACT

According to one embodiment, a wireless communications device includes a low-density parity check (LDPC) decoder configured to receive a codeword associated with a parity check H-matrix. The LDPC decoder includes multiple processing elements coupled to a memory for storing the parity check H-matrix comprising R rows and C columns. Each processing element is configured to perform LDPC decoding on different rows of the H-matrix during multiple sub-iterations. A first portion of the processing elements are configured to process certain rows in an upward direction in the H-matrix relative to other rows and a second portion of the processing elements are configured to process other certain rows in a downward direction in the H-matrix relative to the other rows.

20 Claims, 8 Drawing Sheets

HIGH THROUGHPUT LDPC DECODER

CROSS-REFERENCE TO RELATED APPLICATION(S) AND CLAIM OF PRIORITY

The present application is related to U.S. Provisional Patent Application No. 61/485,049, filed May 11, 2011, entitled "HIGH THROUGHPUT LDPC DECODER". Provisional Patent Application No. 61/485,049 is assigned to the assignee of the present application and is hereby incorporated by reference into the present application as if fully set forth herein. The present application hereby claims priority under 35 U.S.C. §119(e) to U.S. Provisional Patent Application No. 61/485,049.

TECHNICAL FIELD

The present application relates generally to encoding devices, and more particularly, to a high throughput LDPC decoder.

BACKGROUND

Low density parity check (LDPC) codes are channel codes used in forward error correcting (FEC) schemes. LDPC codes are well known for their good performance. Moreover, their structure is suitable for parallel decoding, which makes them suitable for relatively fast decoding. The ability to provide fast decoding may be particularly useful for today's high speed communication networks that are currently being deployed. Consequently, many of the currently active telecommunication standards have LDPC codes in their physical layer FEC scheme, such as the Institute of Electrical and Electronics Engineers (IEEE) 802.16e standard, IEEE 802.15c standard, and Digital Video Broadcasting—Satellite—Second Generation (DVB-S2) standard.

SUMMARY

According to one embodiment, a wireless communications device includes a low-density parity check (LDPC) decoder configured to receive a codeword associated with a parity check H-matrix. The LDPC decoder includes multiple processing elements coupled to a memory for storing the parity check H-matrix comprising R rows and C columns. Each processing element is configured to perform LDPC decoding on one of a plurality of first rows of the H-matrix during a first sub-iteration and perform LDPC decoding on one of a plurality of second rows of the H-matrix during a second sub-iteration. Each of the second rows being different from one another and from the plurality of first rows. A first portion of the processing elements are configured to process one of the second rows in an upward direction in the H-matrix relative to the first row and a second portion of the processing elements are configured to process one of the second rows in a downward direction in the H-matrix relative to the first row.

According to another embodiment, a decoding method includes performing LDPC decoding, using a plurality of processing elements, on one of a plurality of first rows of the H-matrix during a first sub-iteration, storing extrinsic information generated by the decoding in a memory, and performing LDPC decoding on one of a plurality of second rows of the H-matrix during a second sub-iteration. Each of the second rows being different from one another and from the plurality of first rows. A first portion of the processing elements process one of the second rows in an upward direction in the H-matrix relative to the first row and a second portion of the processing elements process one of the second rows in a downward direction in the H-matrix relative to the first row.

According to another embodiment, code embodied on a non-statutory computer readable medium that is configured to, when executed by a computer, perform LDPC decoding, using a plurality of processing elements, on one of a plurality of first rows of the H-matrix during a first sub-iteration, store extrinsic information generated by the decoding in a memory, and perform LDPC decoding on one of a plurality of second rows of the H-matrix during a second sub-iteration. Each of the second rows being different from one another and from the plurality of first rows. A first portion of the processing elements process one of the second rows in an upward direction in the H-matrix relative to the first row and a second portion of the processing elements process one of the second rows in a downward direction in the H-matrix relative to the first row Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 8B, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless or wireline communication system.

The present disclosure describes an apparatus and method to reduce computational complexity for LDPC decoders using a Parallel Processing Layered (PPL) technique. The proposed technique uses multiple processors that simultaneously perform LDPC decoding on a corresponding multiple Z-grouped rows of a LDPC H-matrix during a first sub-iteration, and subsequently perform LDPC decoding on a corresponding multiple rows in different directions (e.g., upwards or downwards on the rows of the H-matrix) relative to one another. Certain embodiments may include LDPC processing of the H-matrix using a maximum likelihood (ML) approach or a sum of products algorithm (SPA) decoding approach prior to, or after the H-matrix is at least partially decoded using the PPL technique.

Figure 1:
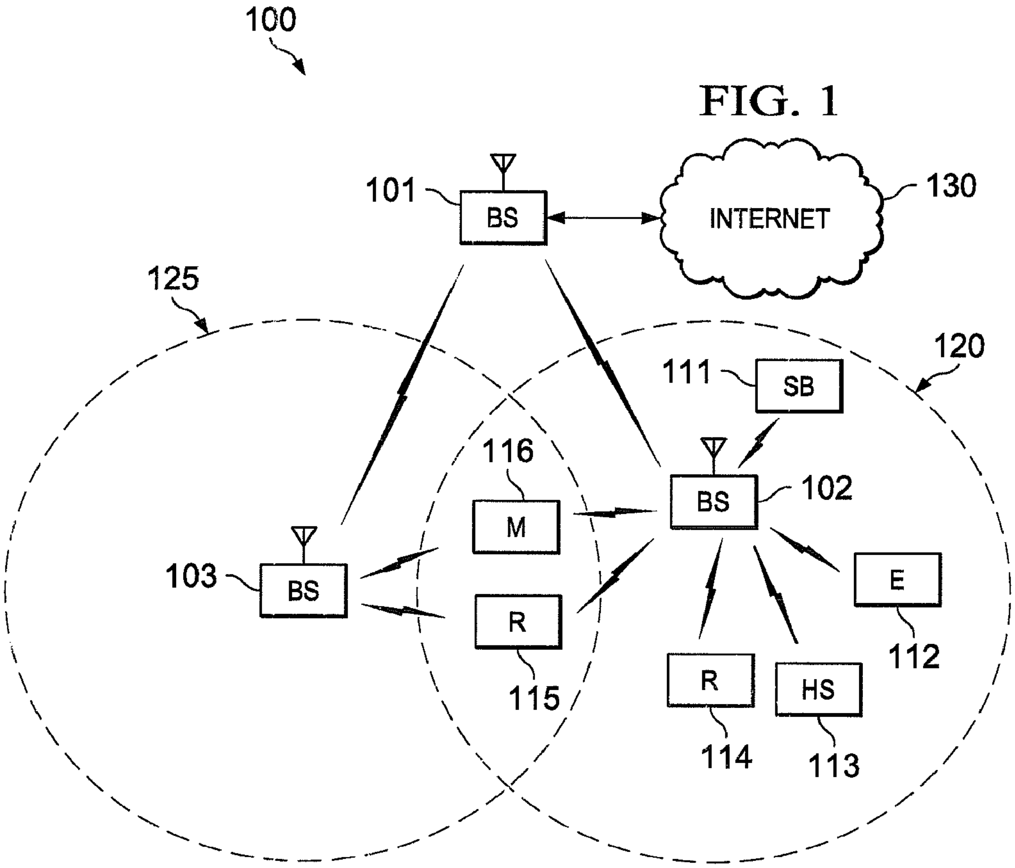
FIG. 1 illustrates an exemplary wireless network, which performs LDPC encodings and decoding according to the principles of the present disclosure.

FIG. 1 illustrates an exemplary wireless network 100, which performs LDPC encodings and decoding according to the principles of the present disclosure. In the illustrated embodiment, wireless network 100 includes base station (BS) 101, base station (BS) 102, base station (BS) 103, and other similar base stations (not shown). Base station 101 is in communication with base station 102 and base station 103. Base station 101 is also in communication with Internet 130 or a similar IP-based network (not shown).

Base station 102 provides wireless broadband access (via base station 101) to Internet 130 to a first plurality of mobile stations within coverage area 120 of base station 102. The first plurality of mobile stations includes mobile station 111, which may be located in a small business (SB), mobile station 112, which may be located in an enterprise (E), mobile station 113, which may be located in a WiFi hotspot (HS), mobile station 114, which may be located in a first residence (R), mobile station 115, which may be located in a second residence (R), and mobile station 116, which may be a mobile device (M), such as a cell phone, a wireless laptop, a wireless PDA, or the like.

Base station 103 provides wireless broadband access (via base station 101) to Internet 130 to a second plurality of mobile stations within coverage area 125 of base station 103. The second plurality of mobile stations includes mobile station 115 and mobile station 116. In an exemplary embodiment, base stations 101-103 may communicate with each other and with mobile stations 111-116 using OFDM or OFDMA techniques.

Base station 101 may be in communication with either a greater number or a lesser number of base stations. Furthermore, while only six mobile stations are depicted in FIG. 1, it is understood that wireless network 100 may provide wireless broadband access to additional mobile stations. It is noted that mobile station 115 and mobile station 116 are located on the edges of both coverage area 120 and coverage area 125. Mobile station 115 and mobile station 116 each communicate with both base station 102 and base station 103 and may be said to be operating in handoff mode, as known to those of skill in the art.

Mobile stations 111-116 may access voice, data, video, video conferencing, and/or other broadband services via Internet 130. In an exemplary embodiment, one or more of mobile stations 111-116 may be associated with an access point (AP) of a WiFi WLAN. Mobile station 116 may be any of a number of mobile devices, including a wireless-enabled laptop computer, personal data assistant, notebook, handheld device, or other wireless-enabled device. Mobile stations 114 and 115 may be, for example, a wireless-enabled personal computer (PC), a laptop computer, a gateway, or another device.

Figure 2A:
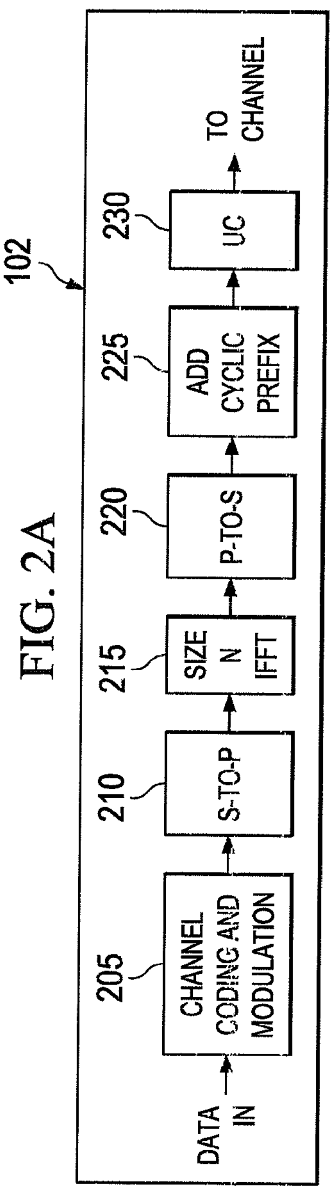
FIGS. 2A and 2B each illustrate an example orthogonal frequency division multiple access (OFDMA) transmit path and receive path, respectively, according to one embodiment of the present disclosure.
Figure 2B:
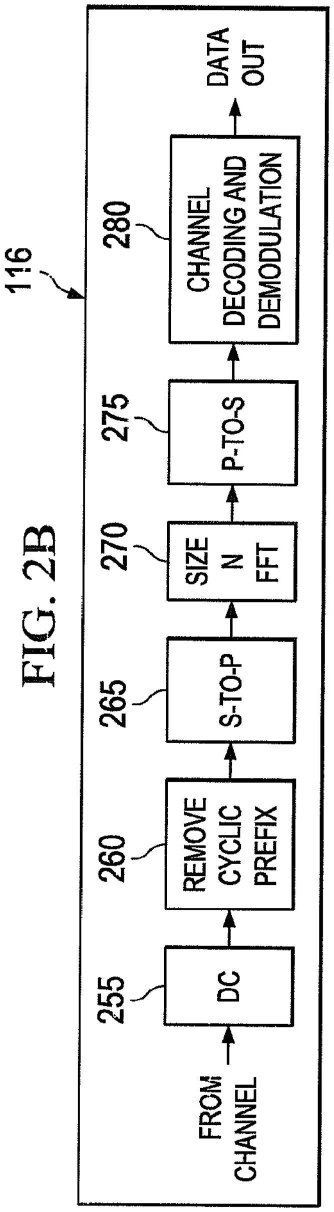

FIG. 2A is a high-level diagram of an orthogonal frequency division multiple access (OFDMA) transmit path. FIG. 2B is a high-level diagram of an orthogonal frequency division multiple access (OFDMA) receive path. In FIGS. 2A and 2B, the OFDMA transmit path is implemented in base station (BS) 102 and the OFDMA receive path is implemented in mobile station (MS) 116 for the purposes of illustration and explanation only. However, it will be understood by those skilled in the art that the OFDMA receive path may also be implemented in BS 102 and the OFDMA transmit path may be implemented in MS 116.

The transmit path in BS 102 comprises channel coding and modulation block 205, serial-to-parallel (S-to-P) block 210, Size N Inverse Fast Fourier Transform (IFFT) block 215, parallel-to-serial (P-to-S) block 220, add cyclic prefix block 225, up-converter (UC) 230. The receive path in MS 116 comprises down-converter (DC) 255, remove cyclic prefix block 260, serial-to-parallel (S-to-P) block 265, Size N Fast Fourier Transform (FFT) block 270, parallel-to-serial (P-to-S) block 275, channel decoding and demodulation block 280.

At least some of the components in FIGS. 2A and 2B may be implemented in software while other components may be implemented by configurable hardware or a mixture of software and configurable hardware. In particular, it is noted that the FFT blocks and the IFFT blocks described in this disclosure document may be implemented as configurable software algorithms, where the value of Size N may be modified according to the implementation.

In BS 102, channel coding and modulation block 205 receives a set of information bits, applies LDPC coding and modulates (e.g., QPSK, QAM) the input bits to produce a sequence of frequency-domain modulation symbols. Serial-to-parallel block 210 converts (i.e., de-multiplexes) the serial modulated symbols to parallel data to produce N parallel symbol streams where N is the IFFT/FFT size used in BS 102 and MS 116. Size N IFFT block 215 then performs an IFFT operation on the N parallel symbol streams to produce time-domain output signals. Parallel-to-serial block 220 converts (i.e., multiplexes) the parallel time-domain output symbols from Size N IFFT block 215 to produce a serial time-domain signal. Add cyclic prefix block 225 then inserts a cyclic prefix to the time-domain signal. Finally, up-converter 230 modulates (i.e., up-converts) the output of add cyclic prefix block 225 to RF frequency for transmission via a wireless channel. The signal may also be filtered at baseband before conversion to RF frequency.

The transmitted RF signal arrives at MS 116 after passing through the wireless channel and reverse operations to those at BS 102 are performed. Down-converter 255 down-converts the received signal to baseband frequency and remove cyclic prefix block 260 removes the cyclic prefix to produce the serial time-domain baseband signal. Serial-to-parallel block 265 converts the time-domain baseband signal to parallel time domain signals. Size N FFT block 270 then performs an FFT algorithm to produce N parallel frequency-domain signals. Parallel-to-serial block 275 converts the parallel frequency-domain signals to a sequence of modulated data symbols. Channel decoding and demodulation block 280 demodulates and then decodes (i.e., performs LDPC decoding) the modulated symbols to recover the original input data stream.

Each of base stations 101-103 may implement a transmit path that is analogous to transmitting in the downlink to mobile stations 111-116 and may implement a receive path that is analogous to receiving in the uplink from mobile stations 111-116. Similarly, each one of mobile stations 111-116 may implement a transmit path corresponding to the architecture for transmitting in the uplink to base stations 101-103 and may implement a receive path corresponding to the architecture for receiving in the downlink from base stations 101-103.

The channel decoding and demodulation block 280 decodes the received data. The channel decoding and demodulation block 280 includes a decoder configured to perform a low density parity check decoding operation. In some embodiments, the channel decoding and demodulation block 280 comprises one or more context-based operation reconfigurable instruction set processors (CRISPs), such as the CRISP processor(s) described in one or more of application Ser. No. 11/123,313, filed May 6, 2005 and entitled "Context-Based Operation Reconfigurable Instruction Set Processor And Method Of Operation"; U.S. Pat. No. 7,769, 912, filed Jun. 1, 2005 and entitled "MultiStandard SDR Architecture Using Context-Based Operation Reconfigurable Instruction Set Processors"; U.S. Pat. No. 7,483,933, issued Jan. 27, 2009 and entitled "Correlation Architecture For Use In Software-Defined Radio Systems"; application Ser. No. 11/225,479, filed Sep. 13, 2005 and entitled "Turbo Code Decoder Architecture For Use In Software-Defined Radio Systems"; and application Ser. No. 11/501,577, filed Aug. 9, 2006 and entitled "Multi-Code Correlation Architecture For Use In Software-Defined Radio Systems", all of which are hereby incorporated by reference into the present application as if fully set forth herein.

Figure 3:
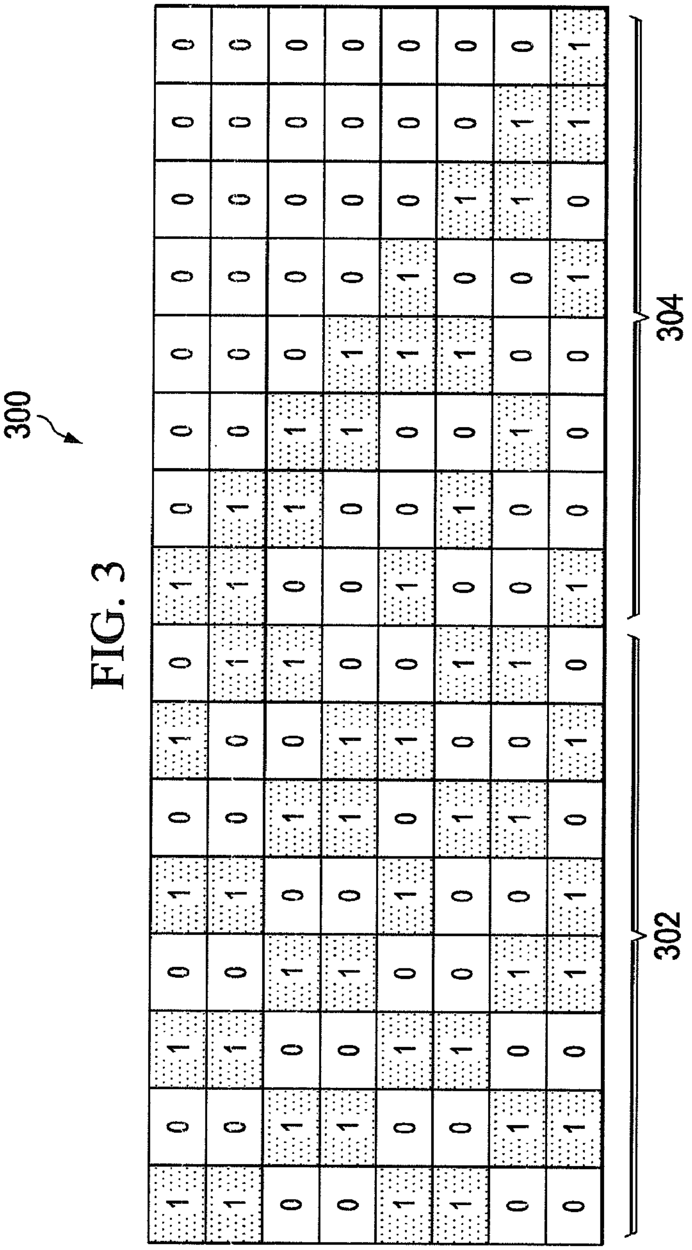
FIG. 3 illustrates an example parity check H-matrix associated with a LDPC encoding scheme according to embodiments of the present disclosure.

FIG. 3 illustrates a parity check H-matrix associated with a LDPC encoding scheme according to embodiments of the present disclosure. The embodiment of the H-matrix 300 shown in FIG. 3 is for illustration only. Other embodiments could be used without departing from the scope of this disclosure.

The H-matrix 300 as shown is a ½ code rate H-matrix conforming to the WiGig standard. In other embodiments, the H-matrix may have any suitable rate, such as a ⅝, ¾, or a 13/16 code rate. Additionally, the H-matrix 300 shown has a block size (N) of 672 bits with a lifting factor (Z) of 42. Other embodiments of H-matrices for use with the present disclosure may have other block sizes and lifting (Z) factors.

The rate ½ H-matrix 300 is a 576×288 matrix that represents a transmission of five hundred seventy-six (576) bits per frame (bpf). In the H-matrix 300, the first eight columns 302 represent systematic (or data) bits while the second eight columns 304 represent parity (or redundancy) bits. Each bit is a location bit that represents a 24×24 matrix. The Z-factor defines the number of bits per matrix. For example, the Z-Factor as shown is set to '42'. As such, using the H-matrix shown, each frame in the transmission includes two-hundred eighty-eight systematic bits and two-hundred eighty-eight parity bits. A '−1' value represents a zero matrix. Accordingly, the '−1' value indicates that the location is not used in the calculation. The remaining values (i.e., those having values other than '−1') are location values that represent a matrix.

Figure 4:
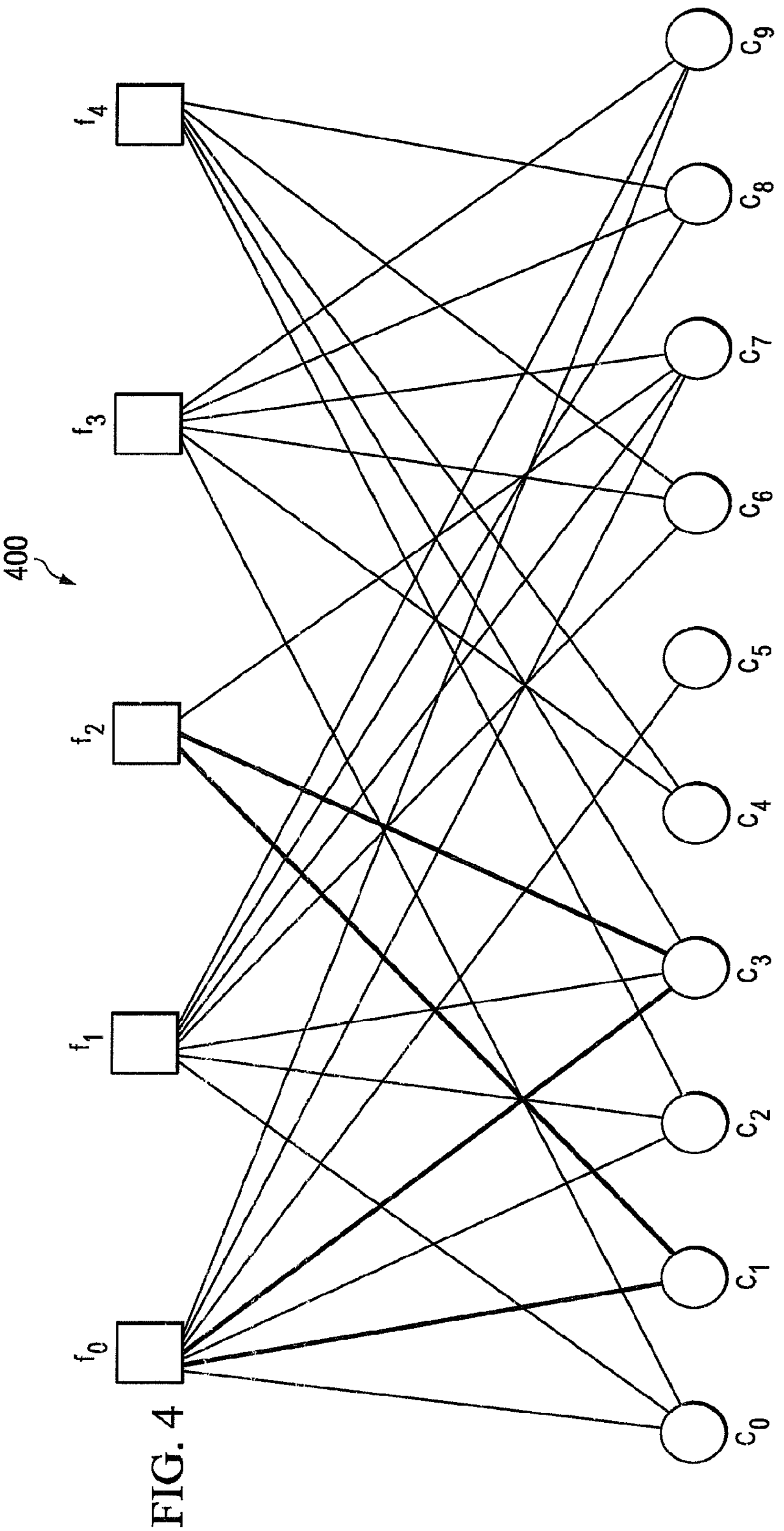
FIG. 4 illustrates an example tanner graph, which corresponds to a parity check matrix according to embodiments of the present disclosure.

FIG. 4 illustrates Tanner graph 400, which corresponds to a parity check matrix according to embodiments of the present disclosure. The embodiment of Tanner graph 400 shown in FIG. 4 is for illustration only. Other embodiments of Tanner graph 400 may be used without departing from the scope of this disclosure.

Tanner graph 400 is a bipartite graph. In bipartite graphs, nodes are separated into two distinctive sets and edges only connect nodes of two different types. The two types of nodes in Tanner graph 400 are referred to as variable nodes (hereafter, "v-nodes") and check nodes (hereafter, "c-nodes").

V-nodes correspond to bits of the codeword or, equivalently, to columns of the parity check H-matrix. There are n v-nodes. V-nodes are also referenced as "bit nodes". C-nodes correspond to parity check equations or, equivalently, to rows of the parity check H-matrix. There are at least m=n−k c-nodes.

Tanner graph 400 corresponds to the parity check H-matrix illustrated by Equation 1. Tanner graph 400 includes five (5) c-nodes (the number of parity bits) and ten (10) v-nodes (the number of bits in a codeword). C-node fi is connected to v-node $c_j$ if the element $h_{ij}$ of H-matrix is a binary 1. For example, c-node f0 is connected $c_0$, $c_1$, $c_2$, $c_3$, $c_5$, $c_7$ and $c_9$. The connection between $f_0$ and $c_0$ corresponds to $h_{00}$; the connection between $f_0$ and $c_2$ corresponds to $h_{01}$; and so on. Therefore, the connections to $f_0$ correspond to the first row in the H-matrix, further illustrated in Equation 1:

$$\vec{H}_0=[1111010101] \quad \text{[Eqn. 1]}$$

A degree of a node is the number of edges (e.g., connections) connected to the node. A sub-iteration, one the other hand, is a path representing a single set of edges from a VN to one or more CNs. An iteration is the total length, in Tanner graph 400, of a path of distinct edges that closes upon itself. A path from $c_1 \rightarrow f_2 \rightarrow c_2 \rightarrow f_0 \rightarrow c_1$ is an example of a short iteration. Short iterations should be avoided since short iterations adversely affect decoding performance. Short iterations manifest themselves in the H-matrix by columns with an overlap of two.

The increased demand for high definition and three-dimensional (3D) media, and the shift toward cloud computing emphasizes the need for high throughput wireless communication systems. However, implementing such high data-rate systems poses a number of engineering challenges. One of the main challenges in the implementation of such high data-rate systems is the design of a high throughput error control scheme. Low Density Parity Check (LDPC) codes that were originally introduced in the sixties have recently received a large amount of attention. One reason for this is due to their ability to achieve performance close to the Shannon limit. Additionally, their structure is suitable for fast and efficient parallel decoding. Consequently, many of the currently active telecommunication standards, such as the IEEE 802.16e standard, the Wireless Gigabit Alliance (WiGig), the IEEE 802.15.3c standard, and the DVB-S2 standard, utilize LDPC codes in their physical layer error control scheme.

The relatively good performance of LDPC codes may provide high data rate systems, however, higher rate systems and especially higher rate channel coders such as LDPC and Turbo coders, requires higher hardware complexity and increased power consumption. Increased power consumption is more important in the case of battery-powered mobile devices that are designed to support these new emerging wireless standards. This often necessitates making the new emerging high throughput LDPC decoders highly power efficient to consume the minimum power while providing high throughput with the highest performance and quality.

Known LDPC decoding techniques may include a Maximum Likelihood (ML) technique, and a Log domain Sum-of-Products Algorithm (SPA) technique.

The Maximum Likelihood (ML) decoding technique essentially selects the codeword that maximizes the likelihood of the received signal. However, the ML technique may be impractical to implement for large block sizes due to its high computation complexity.

The Maximum Likelihood method may be represented as:

$$\mathrm{argmax}_i P(\bar{r}|\bar{x}_i) \qquad \text{[Eqn. 2]}$$

where r is the input signal to the Decoder and xi, i={0:2N−1} is the set of all possible codes in that satisfy:

$$\bar{x}_i H^T = \bar{0} \qquad \text{[Eqn. 3]}$$

where H is the parity check matrix of the LDPC code (i.e. H-Matrix). Note that the minimum distance search is over a constrained number of possibilities. The constrained possibilities are given based on the H-Matrix of the LDPC. In the case of transmission over an AWGN channel, the ML can be further simplified to:

$$\mathrm{argmin}_i \sum_{j=0}^{N-1} (r_j - x_{ij})^2 \qquad \text{[Eqn. 4]}$$

which if all the xi have the same power, is equivalent to:

$$\mathrm{argmax}_i \sum_{j=0}^{N-1} r_j x_{ij} \qquad \text{[Eqn. 5]}$$

In general, the ML technique provides the fastest convergence (only a single iteration is required), thereby providing the highest rate of processing for a given hardware processing capability. However, the hardware (HW) complexity makes it impractical to implement for block size N bigger than 16 bits.

The Sum-of-Products Algorithm (SPA) technique and its corresponding Log-SPA technique provide a more practical approach to implementation of LDPC decoding in hardware. The log-domain SPA technique is an iterative decoder with messages passed between check nodes (CNs) and variable nodes (VNs) in a Tanner graph representation of the codeword. The message passed from check node (CN) j to variable node (VN) i is the Log Likelihood Ratio (LLR):

$$L(r_{ji}) = 2\tanh^{-1}\prod_{i' \in V_{j\backslash i}} \tanh\left(\frac{1}{2}L(q_{i'j})\right) \qquad \text{[Eqn. 6]}$$

where $L(q_{ij})$ is the (extrinsic) LLR message passing from $VN_i$ to $CN_j$:

$$\begin{aligned} L(q_{ij}) &= \log\frac{q_{ij}(0)}{q_{ij}(1)} \\ &= \alpha_{ij}\beta_{ij} = \\ &= L(c_i) + \sum_{j' \in C_{i\backslash j}} L(r_{j'i}) \end{aligned} \qquad \text{[Eqn. 7]}$$

where $L(c_i)$ is the LLR of $VN_i$, and:

$$\alpha_{ij} = \mathrm{sign}(L(q_{ij})) \qquad \text{[Eqn. 8]}$$

and $$\beta_{ij} = |L(q_{ij})| \qquad \text{[Eqn. 9]}$$

From equations (6-9) above it can be seen that hardware complexity is still relatively high due to numerous multiplications in each iteration and large look up tables that are used to decode the bits. In addition, the SPA technique often requires multiple iterations to converge. The number of iterations dictates the maximum processing rate of the decoder.

According to one embodiment of the present disclosure, a parallel processing layered (PPL) technique is provided that uses a Scaled Min-Sum decoding approach to decrease the number of iterations required to converge the H-matrix. This reduction in iterations may reduce LDPC decoding latency relative to the conventional decoding techniques described above. In certain embodiments, this reduction in the number of iterations may provide the required rate of decoding at a receiver to support future LDPC codes with an efficient hardware architecture.

The scaled Min-Sum technique uses a minimum operation to find the magnitude of the soft bits per check node. Equation (10) shown herein below describes the Scaled Min-Sum Method.

$$L(r_{ji}) = A\Pi_{i' \in V_{j\backslash i}}\alpha_{i'j}\min_{i' \in V_{j\backslash i}}\beta_{i'j} \qquad \text{[Eqn. 10]}$$

The Min-Sum technique may be relatively simple to implement since it only needs to find the two smallest values of each variable node (VN) per check node (CN) and sum all the results per variable node (VN). The resulting hardware complexity of the Min-Sum technique in many cases, is lower than the other methods discussed above. However, the Frame Error Rate (FER) may be often inferior compared to the SPA or the ML technique. That is, it often uses more iterations than the other decoding schemes, which leads to a decrease in the effective processing rate at the receiver. To improve the FER, a correction factor is typically used to scale the minimum values. Empirically, a scale factor A of 0.75 to the minimum values before adding back to the current extrinsic values tends to provide relatively good performance. This scaled value A is similar to that of Turbo decoding techniques. Nevertheless, the Min-Sum approach requires a relatively high number of iterations which again may effectively limit its processing rate.

Based on the comparison of the above methods, it may be concluded that the PPL technique that uses a Scaled Min-Sum approach may provide certain benefits that may be useful for LDPC decoding, even though other LDPC decoding techniques, such as the ML technique, provides maximal throughput. Certain embodiments of the PPL technique provides enhanced feasibility for hardware implementation in terms of low complexity and power by reducing the number of iterations.

The PPL technique may be implemented using a flooding approach or a layered approach. The flooding approach assigns parallel minimum (min) processors to each row in the H-Matrix. All CN entries per VN are summed to produce the extrinsic information for the next iteration.

The example LDPC H-matrix 300 (FIG. 3) used in the WiGig standard supports only one block size of N=672 bits with different code rates of ½, ⅝, ¾, and 13/16. In the WiGig standard, the rows and columns (VNs) are grouped by a lifting factor of Z=42. The H-Matrix tables for all rates (e.g., ½, ⅝, ¾, and 13/16) are 4-layer decodable (13/16 rate requires only S-layers). Because WiGig codewords are 4-layer decodable, it can be processed using four parallel machines that simultaneously process the whole H-Matrix in one cycle per iteration. It can be seen that rows (1,3), (2,4), (5,7), and (6,8) are row pairs that make the LDPC Rate ½ 4-Layer decodable.

One particular advantage of the flooding approach is that the processing rate per iteration is high. Nevertheless, the flooding approach uses a relatively large number of iterations to converge. This is principally due to the lack of data sharing among the multiple processors that operate on the same extrinsic values received from the previous iteration.

In contrast, the Layered Approach serially processes each row to avoid contention in each group of independently grouped rows. Furthermore, the layered approach may process the independent rows in parallel. For example, the H-matrix 300 shown above is 4-layer decodable which means for the layered approach that even though the number of grouped rows is (1−R)N/Z=8 grouped rows, it is guaranteed that these eight rows can be further grouped in four pairs of rows in which each pair includes two independent rows.

The Layered approach is slower than the flooding approach in terms of number of cycles per iteration since the processing is done sequentially for each row in the H-Matrix while updating the extrinsic values in each row before proceeding to the next row. Since the Layered approach is slower and it updates the extrinsic values of each row, it requires fewer iterations to converge to the same performance as the flooding approach (typically 33% fewer iterations). In addition, the layered approach does not sum the CNs results per VN since the layered approach is essentially contention-free and only one Check Node (CN) is used at a time per VN. Thus, the critical path may be reduced while increasing the decoding processing frequency.

The WiGig standard provides for a 4.6 Giga-bits-per-second data transfer rate. In order to support this data transfer rate, a decoder using the layered approach may use four processors that function in parallel. In this case, decoders using both the flooding and layered approaches have the same processing complexity (e.g., four processors) per iteration. However, layered decoding requires approximately 33 percent less number of iterations to converge than the flooding approach, which may reduce the latency by a corresponding 33 percent. In a typical case of Orthogonal Frequency-Division Multiplexing (OFDM) having a Binary Phase-Shift Keying (BPSK) modulation scheme, where there are N number of bits per a single OFDM symbol, the performance of both the flooding and layered approaches may be comparable. However, in a higher modulation scheme case such as the WiGig standard, which uses OFDM with 16 Quadrature Amplitude Modulation (16QAM), the entire four blocks are provided in the same OFDM symbol. Hence, optimizing the decoding of the four blocks by assigning one processor per block may significantly reduce the HW complexity. Future LDPC codes may be defined that include larger block sizes that, in some cases, may consume the entire OFDM symbol period for each modulation scheme (e.g., 2×N block size for QPSK, 4×N for 16QAM and 6×N for 64QAM modulation schemes). Hence, the latency and hardware complexity may increase for higher modulation schemes as the block size increases.

For both the flooding and layered approaches, in addition to the extrinsic information, the contribution of each VN from the previous iteration should be stored since the period (t) needs to be subtracted when processing the same CN in the next iteration. The size of this memory depends on the maximum number of CNs connected to a single VN (Wc) of each VN. Therefore, a row LLR may be defined in which its memory used to store extrinsic values is N×Wc bytes assuming 8-bit soft decision precision.

The PPL technique uses multiple processors (K) that initially performs LDPC decoding on different Z-grouped rows of an H-matrix during a first sub-iteration, and subsequently performs LDPC decoding on other rows in different directions relative to one another. That is, each processor performs LDPC decoding on another row during a subsequent sub-iteration that is either upwards or downwards in the H-matrix from the row processed during the previous sub-iteration. For the H-matrix shown above that is 4-layer decodable, four (K=4) processors may be used in two sub-iterations to completely decode the H-matrix.

The number of possible parallel processors is P=(no. of directions=2)×(number of Z-grouped rows). In case of a H-matrix having Rate ½ conforming to the WiGig standard, the number of Z-grouped rows is 8, hence 16 processors can be used. This method can be further expanded to P=((1−R) N/Z)! number of parallel processors to increase performance. In the end of processing of all rows in parallel, the equation for the VN is given by:

$$L(r_{ji})=\gamma_{ji}A(\max_k|L(r_{jik})|) \quad \text{[Eqn. 11]}$$

where:

$$L(r_{jik})=\Pi_{i'\in V_{j\backslash i}}\alpha_{i'jk}\min_{i'\in v_{j\backslash i}}\beta_{i'jk} \quad \text{[Eqn. 12]}$$

and:

$$\gamma_{ji}=\text{sign}(L(r_{jim})) \quad \text{[Eqn. 13]}$$

where:

$$m=\text{argmax}_k|L(r_{jik})| \quad \text{[Eqn. 14]}$$

Note that k is the k-th processor extrinsic result. The output extrinsic per iteration is the maximum value of all possible extrinsic values derived from each processor $P_0$ to PK−1. This method can be used either in a single iteration or in multiple iterations. The same Min-Sum equations are valid for use between iterations. However, for one iteration decoding, row LLR memory may not need to be stored. Thus, certain embodiments that use one iteration decoding may provide an advantage in that extrinsics need not be saved which may provide a reduction in hardware and power usage.

Figure 5:
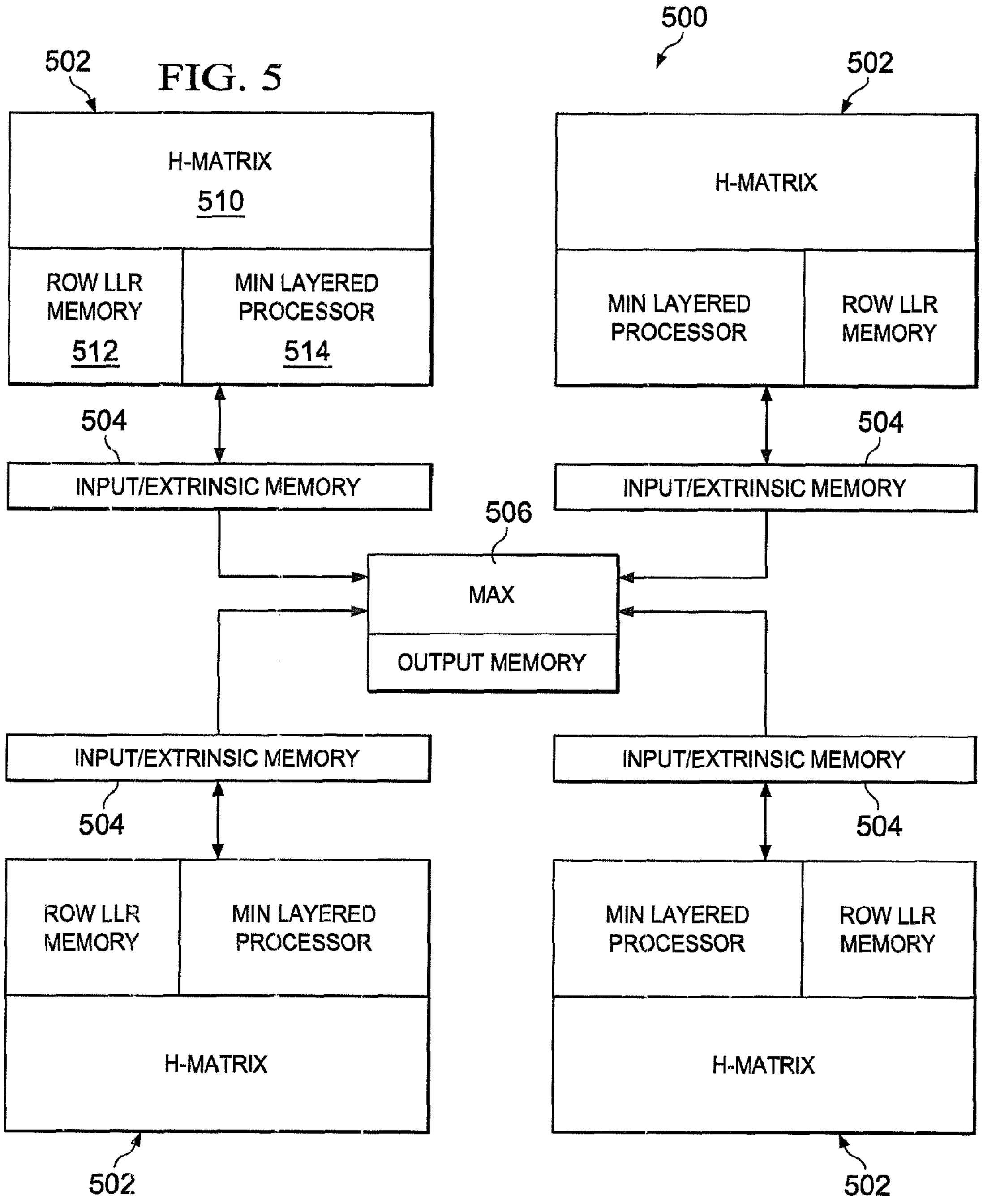
FIG. 5 illustrates an example hardware structure that is configured to support the parallel processing layered (PPL) technique according to one embodiment of the present disclosure.

FIG. 5 illustrates an example hardware structure 500 that is configured to support the PPL technique according to one embodiment of the present disclosure. The hardware structure 500 includes four processors 502 coupled to corresponding extrinsic memory units 504, and a decision processing core 506. In one embodiment, the hardware structure 500 shown may be implemented on a context-based operation reconfigurable instruction set processors (CRISPs), such as the CRISP processor(s) described in one or more of application Ser. No. 11/123,313, filed May 6, 2005 and entitled "Context-Based Operation Reconfigurable Instruction Set Processor And Method Of Operation" which is hereby incorporated by reference.

The hardware structure 500 as shown may be particularly conducive to H-matrices having a multiple number of four Z-grouped rows. For example, the hardware structure 500 as shown having four processors 502 may be used to perform LDPC decoding on a H-matrix having eight Z-grouped rows such that the H-matrix may be fully decoded in two sub-iterations. In other embodiments, the hardware structure 500 may have less than four processors or greater than four processors.

Each processing element 502 includes a temporary storage 510 for temporarily storing a copy of an input H-matrix, a row Log Likelihood Ratio (LLR) memory 512 for storing probability values associated with each calculation of CNs relative to VNs, and a Min Layered processing core 514. Although this particular embodiment shows that decision processing core 506 is configured to perform LDPC processing according to the Scaled Min-Sum decoding technique, any suitable LDPC decoding technique, such as the ML technique, or the SPA decoding technique may be used.

The decision processing core 506 calculates soft-decision values for extrinsic values derived by each processing core 502 and stored in extrinsic memory units 504. As shown, decision processing core 506 calculates soft-decision values according to a progressive weighting process for each edge comparison of CNs relative to VNs as described above with reference to FIG. 4. That is, a weighting value may be initially assigned to a CN that may be increased or decreased in value based upon each iterative edge comparison in the LDPC decoding process. In one embodiment, the decision processing core 506 provides feedback of the weighting values of each CN to be used in subsequent sub-iterations of other rows of the H-matrix. The weighting values may be fed back to processors 514 following each sub-iteration or following multiple sub-iterations.

Although the decision processing core 506 as shown calculates soft-decision values according to a progressive weighting process, the decision processing core 506 may calculate soft-decision values according to any suitable process, such as a summation process that sums parity check values from all edges of a group of VNs associated with each CN.

The hardware structure 500 may be embodied in any suitable mechanism for which decoding of codewords according to an LDPC technique may be performed. For example, the hardware structure 500 may be embodied in a wireless receiver, such a cellular telephone. Given the relatively high data transfer rates allowed in the IEEE 802.16e standard, reasonably accurate decoding may be prohibitive for small devices, such as cellular telephones, using conventional decoding techniques that are computationally complex and therefore consume excessive power for their operation. Certain embodiments of the present disclosure may provide an advantage in that reduced iterations provided by the PPL technique consume less power and therefore may allow communication, by cellular telephones and other small, battery powered wireless devices, at the relatively high data transfer rates provided in the IEEE 802.16e standard.

Figure 6:
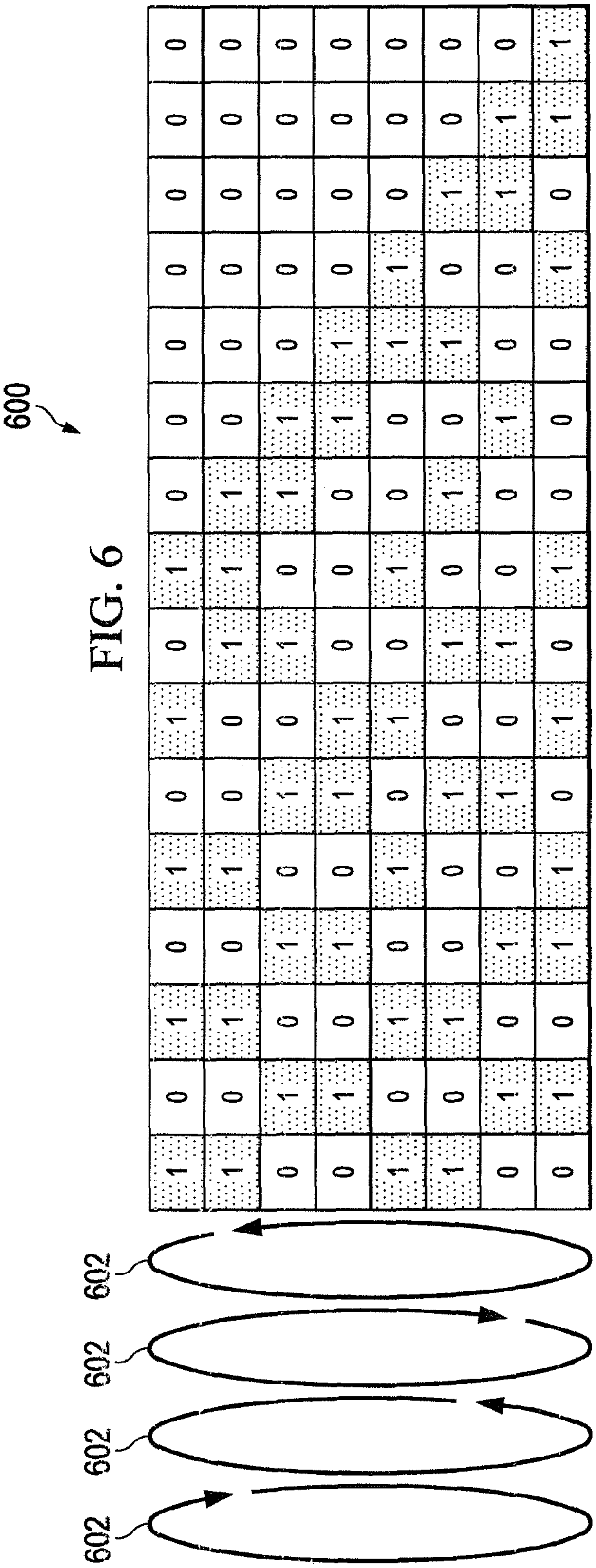
FIG. 6 illustrates an example process depicting how an H-matrix may be decoded using the PPL technique according to one embodiment of the present disclosure.

FIG. 6 illustrates an example process depicting how an H-matrix may be decoded using the PPL technique according to one embodiment of the present disclosure. The H-matrix 600 shown represents a ½ rate WiGig H-matrix. It should be understood, however, that the PPL technique according to the present disclosure may be used with any suitable type of H-matrix used for LDPC encryption/decryption.

Circular paths 602 represent successive processing sequences that may be performed by each processor. For example, each circular path 602 may represent a process sequence perform by each processor 514 of FIG. 5. As shown, a portion of the circular paths 602 proceed in a downward direction along the rows of the H-matrix 600, while another portion of circular paths 602 proceed in an upward direction along the rows of the H-matrix 600. For example, one particular processor 514 may initially process row 4 of the H-matrix in a first sub-iteration and subsequently process row 6, which is in a downward direction relative to row 4. Additionally, another particular processor 514 may initially process row 8 of the H-matrix in the first sub-iteration and subsequently process row 5, which is in an upward direction relative to row 8.

In one embodiment, any suitable row sequence configuration may be used. In fact, the possible combinations of sequence configurations may be n!, where n is the number of rows of the H-matrix. In another embodiment, the sequence configuration may be randomized such that successive iterations of multiple H-matrices may be conducted with differing row sequence configurations.

Table 1 depicts various processing sequences that may be performed by each processing element 502 to perform LDPC processing for H-matrices at various WiGig rates.

TABLE 1

PPL Technique constellation for WiGig rates:

| Rate | P0 | P1 | P2 | P3 |
|---|---|---|---|---|
| ½ | 1/up | 8/down | 5/up | 4/down |
| ⅝ | 1/up | 6/down | 4/up | 3/down |
| ¾ | 1/up | 4/down | 3/up | 3/down |
| 13/16 | 1/up | 3/down | 2/up | 1/down |

Although the example processing sequences are provided for use with WiGig H-matrices, other processing sequences may be used for other techniques without departing from the spirit or scope of the present disclosure.

In one embodiment, each processing element 502 in the hardware structure 500 may be configured to adjust its operation according to estimated signal-to-noise (SNR) of received codewords. For example, at high estimated SNR values, the row LLR memory may not be required and therefore electrical power to the LLR memory and associated LLR processing logic may be removed to reduce power consumption.

In another embodiment, the hardware structure 500 may be configured without an early termination mechanism, such as a syndrome checking mechanism, for further reduction in power consumption. This benefit may be provided because the PPL technique converges with relatively few iterations, thus obviating the need for an early termination mechanism.

Figure 7:
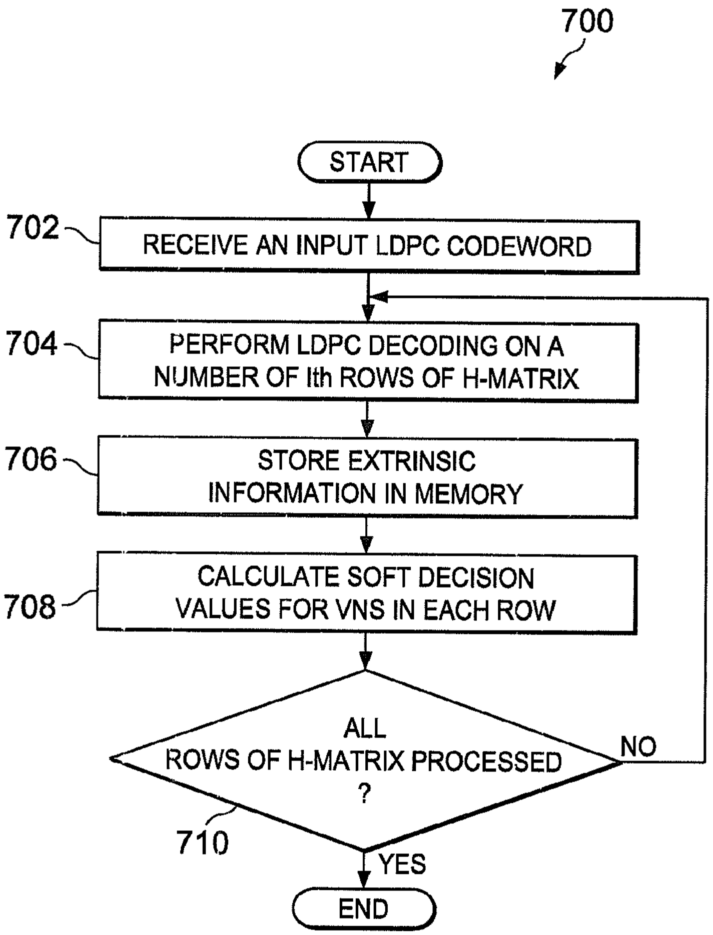
FIG. 7 illustrates an example process for performing PPL decoding of H-matrices associated with a LDPC encoding technique according to one embodiment of the present disclosure.

FIG. 7 illustrates an example process for performing PPL decoding of H-matrices associated with a LDPC encoding technique according to one embodiment of the present disclosure. In step 702, hardware structure 500 receives a codeword comprising a parity check H-matrix encoded according to a LDPC encoding technique. The H-matrix may be any type having multiple Z-grouped rows, such as those conforming to the WiGig standard.

In step 704, multiple processing elements 502 simultaneously perform LDPC decoding on a corresponding multiple number of $i_{th}$ rows of the H-matrix during one processing sub-iteration. For example, given four processing elements configured to process an H-matrix having eight rows, rows 1, 8, 5, and 4 may be processed during one particular sub-iteration.

For subsequent processing sub-iterations, the processing elements 502 may each process other rows that are in different directions relative to the previously processed rows. To continue the example provided above, if the four processing elements initially process rows 1, 8, 5, and 4, these four processing elements may next process rows 3, 6, 7, and 2, respectively. In one embodiment, none of the rows processed during the subsequent sub-iteration are adjacent to a previously processed row by any particular processor.

In step 706, the processing elements 502 store extrinsic information generated from LDPC processing of each row in its respective extrinsic memory 504.

In step 708, the decision processing core 506 calculates soft-decision values for the VNs in each row using the stored extrinsic information. In one embodiment, the decision processing core 506 calculates the soft-decision values according to a progressive weighting process for each edge comparison of CNs relative to VNs. In another embodiment, the decision processing core 506 calculates soft-decision values according to a summation process that sums parity check values from all edges of a group of VNs associated with each CN.

In step 710, the decision processing core 506 determines whether any more rows are to be processed by the processing elements. If additional rows are to be processed, processing reverts back to step 704. However, if no additional rows are to be processed, processing ends in which the codeword comprising the H-matrix has undergone a full iteration.

Although FIG. 6 illustrates one example of a LDPC decoding process, various changes may be made to FIG. 7. For example, the determining step as described in step 710 may be performed by any suitable logic entity, such as by at least one processing element 502. Additionally, the hardware structure 500 may process multiple subsets of rows such that all rows are processed using the PPL technique, or optionally; the hardware structure 500 may process only a portion of all the rows of a H-matrix.

Figure 8A:
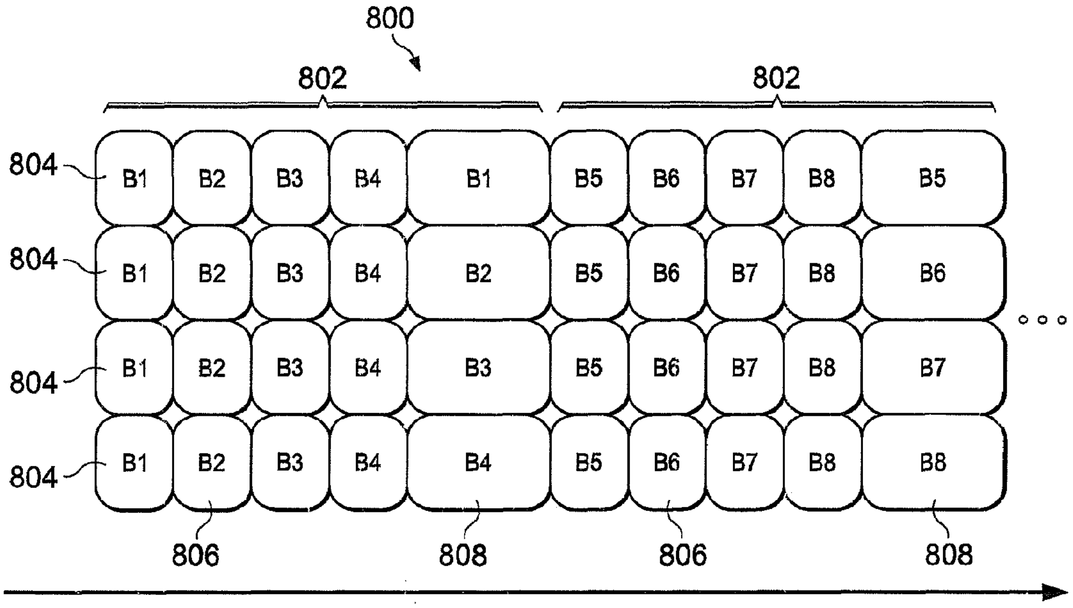
FIGS. 8A and 8B illustrate example hybrid PPL techniques according to one embodiment of the present disclosure that may be used to decode one or more H-matrices.
Figure 8B:
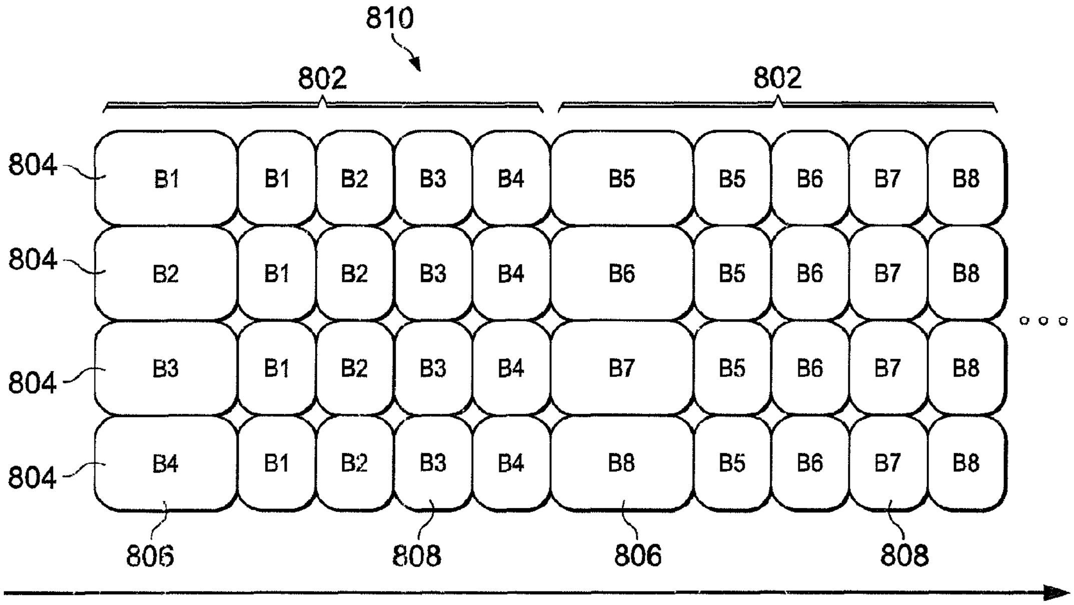

FIGS. 8A and 8B illustrate example hybrid PPL techniques 800 and 810 according to certain embodiments of the present disclosure that may be used to decode one or more H-matrices 802. The hybrid technique 800 may be performed by multiple processing elements 804, which in the particular examples shown are four processing elements. FIG. 8A illustrates one particular embodiment in which the PPL technique 806 as described above is initially performed to provide LDPC decoding of matrices 802 followed by LDPC decoding using the SPA technique 808. Conversely, FIG. 8B illustrates another particular embodiment in which the SPA technique 808 is initially performed to provide LDPC decoding of matrices 802 followed by LDPC decoding using the PPL technique 806. In performing the SPA technique 808, any suitable quantity of sub-iterations may be performed. Likewise, any suitable quantity of sub-iterations may be performed using the PPL technique 806.

Any combination of the PPL technique, the ML technique, and the SPA technique may be used to decode each H-matrix using the hybrid PPL technique. For example, the ML technique may be initially used to decode a H-matrix followed by LDPC decoding using the PPL technique. As another example, the PPL technique may be initially used to decode a H-matrix followed by the ML technique.

Although FIGS. 8A and 8B illustrate several example hybrid PPL techniques, various changes may be made to FIGS. 8A and 8B. For example, although only two H-matrices are decoded in each FIGURE, it is understood that an indefinite quantity of H-matrices may be continually decoded throughout operation of the LDPC decoder using the hybrid PPL technique.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A wireless communications device comprising:

a low-density parity check (LDPC) decoder configured to receive a codeword associated with a parity check H-matrix, the LDPC decoder comprising:

a memory configured to store the parity check H-matrix comprising R rows and C columns; and a plurality of processing elements each configured to:

perform LDPC decoding on one of a plurality of first rows of the H-matrix during a first sub-iteration, each of the first rows being different from one another; and perform LDPC decoding on one of a plurality of second rows of the H-matrix during a second sub-iteration, each of the second rows being different from one another and from the plurality of first rows, wherein a first portion of the processing elements are configured to process one of the second rows in an upward direction in the H-matrix relative to the first row and a second portion of the processing elements are configured to process one of the second rows in a downward direction in the H-matrix relative to the first row.

2. The wireless communications device of claim 1, wherein the quantity of the first portion of processing elements is equal to the quantity of the second portion of processing elements.

3. The wireless communications device of claim 1, wherein the first rows processed during the first sub-iteration and the second rows processed during the second sub-iteration defines a row sequence configuration, the row sequence configuration configured to be selected randomly.

4. The wireless communications device of claim 1, wherein the processing elements are configured to perform LDPC decoding on the H-matrix using at least one of a maximum likelihood (ML) technique and a sum of products algorithm (SPA)technique during a third sub-iteration.

5. The wireless communications device of claim 4, wherein the processors used to perform the LDPC decoding during the first and second sub-iterations are the same processors as those used to perform the LDPC decoding during the third sub-iteration.

6. The wireless communications device of claim 1, wherein the processing elements are configured to, prior to the first sub-iteration, perform LDPC decoding on the H-matrix using at least one of a maximum likelihood (ML) technique and a sum of products algorithm (SPA) technique.

7. The wireless communications device of claim 1, wherein the processing elements are configured to perform LDPC decoding on the first and second rows using a summation technique.

8. The wireless communications device of claim 1, wherein the processing elements are configured to perform LDPC decoding on the first and second rows using a progressive weighting process.

9. A decoding method comprising:

performing LDPC decoding, using a plurality of processing elements, on one of a plurality of first rows of the H-matrix during a first sub-iteration, each of the first rows being different from one another;

storing extrinsic information generated from the decoding in a memory; and performing LDPC decoding on one of a plurality of second rows of the H-matrix during a second sub-iteration, each of the second rows being different from one another and from the plurality of first rows, wherein a first portion of the processing elements process one of the second rows in an upward direction in the H-matrix relative to the first row and a second portion of the processing elements process one of the second rows in a downward direction in the H-matrix relative to the first row.

10. The decoding method of claim 9, further comprising performing LDPC decoding on the H-matrix using at least one of a maximum likelihood (ML) and a sum of products algorithm (SPA) technique during a third sub-iteration.

11. The decoding method of claim 10, wherein the processing elements used to perform the LDPC decoding during the first and second sub-iterations are the same processing elements as those used to perform the LDPC decoding during the third sub-iteration.

12. The decoding method of claim 9, further comprising, prior to the first sub-iteration, performing LDPC decoding on the H-matrix using at least one of a maximum likelihood (ML) and a sum of products algorithm (SPA) technique.

13. The decoding method of claim 9, wherein the processing elements perform LDPC decoding on the first and second rows using a summation process.

14. The decoding method of claim 9, wherein the processing elements perform LDPC decoding on the first and second rows using a progressive weighting process.

15. A non-transitory computer readable medium embodying a computer program, the computer program comprising computer readable program code that, when executed by processing circuitry, causes the processing circuitry to:

perform LDPC decoding, using a plurality of processing elements, on one of a plurality of first rows of the H-matrix during a first sub-iteration, each of the first rows being different from one another;

store the extrinsic information in a memory; and perform LDPC decoding on one of a plurality of second rows of the H-matrix during a second sub-iteration, each of the second rows being different from one another and from the plurality of first rows, wherein a first portion of the processing elements are configured to process one of the second rows in an upward direction in the H-matrix relative to the first row and a second portion of the processing elements are configured to process one of the second rows in a downward direction in the H-matrix relative to the first row.

16. The non-transitory computer readable medium of claim 15, wherein the computer program further comprises computer readable program code that, when executed by the processing circuitry, causes the processing circuitry to perform LDPC decoding on the H-matrix using at least one of a maximum likelihood (ML) and a sum of products algorithm (SPA) technique during a third sub-iteration.

17. The non-transitory computer readable medium of claim 16, wherein the processing elements used to perform the LDPC decoding during the first and second sub-iterations are the same processing elements as those used to perform the LDPC decoding during the third sub-iteration.

18. The non-transitory computer readable medium of claim 15, wherein the computer program further comprises computer readable program code that, when executed by the processing circuitry, causes the processing circuitry to: prior to the first sub-iteration, perform LDPC decoding on the H-matrix using at least one of a maximum likelihood (ML) and a sum of products algorithm (SPA) technique.

19. The non-transitory computer readable medium of claim 15, wherein the computer program further comprises computer readable program code that, when executed by the processing circuitry, causes the processing circuitry to perform LDPC decoding on the first and second rows using a summation process.

20. The non-transitory computer readable medium of claim 15, wherein the computer program further comprises computer readable program code that, executed by circuitry, causes the processing circuitry to perform LDPC decoding on the first and second rows using a progressive weighting process.

* * * * *